(12) United States Patent
Gallarelli et al.

(10) Patent No.: US 6,603,664 B1
(45) Date of Patent: Aug. 5, 2003

(54) COMPUTER SYSTEM HAVING REMOVABLE AND STACKABLE MODULES

(75) Inventors: Pat Gallarelli, Pittsboro, NC (US); David John Jensen, Raleigh, NC (US); Kevin Duane Johnson, Wake, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/252,280

(22) Filed: Sep. 23, 2002

(51) Int. Cl.⁷ .................................................. H05K 7/00
(52) U.S. Cl. ...................... 361/747; 361/686; 361/728; 361/730; 361/732; 361/740; 439/372
(58) Field of Search ................................ 361/683–686, 361/728–732, 735–736, 740–742, 747–748, 752, 754, 756, 759, 784–785, 788, 798, 801–804; 439/372, 327, 157; 312/223.1, 223.2; 211/41.17, 26.2

(56) References Cited

U.S. PATENT DOCUMENTS

| | | | | |
|---|---|---|---|---|
| 3,644,868 A | * | 2/1972 | Nevela | 439/61 |
| 4,006,955 A | * | 2/1977 | Johnson | 439/327 |
| 5,967,825 A | * | 10/1999 | Lima et al. | 439/372 |
| 6,243,273 B1 | * | 6/2001 | Beun et al. | 361/796 |
| 6,354,858 B1 | * | 3/2002 | Cooper et al. | 439/327 |
| 6,366,457 B1 | * | 4/2002 | Otto et al. | 361/685 |
| 6,442,037 B1 | * | 8/2002 | Boe | 361/759 |
| 6,517,369 B1 | * | 2/2003 | Butterbaugh et al. | 439/327 |

* cited by examiner

Primary Examiner—David Martin
Assistant Examiner—Phuong T. Vu
(74) Attorney, Agent, or Firm—Martin J. McKinley

(57) ABSTRACT

An electronic circuits module includes a cover and a base. A lever and cam assembly is rotatably attached to the cover, and the cam includes first and second lobes. The lever and cam assembly is rotatable between first, second and third positions. In the first position, the first lobe can be inserted through an eccentric opening in the base, and then rotated to the second position to lock the cover to the base. In the third position, the module can be inserted into the computer and when the lever and cam assembly is moved back to the second position, the second lobe locks the module in the computer. A mechanism in the computer inhibits the movement of the lever and cam assembly into the first position, thereby preventing the disconnection of the base from the cover when the module is installed in the computer.

6 Claims, 8 Drawing Sheets

COMPUTER SYSTEM HAVING REMOVABLE AND STACKABLE MODULES

CROSS REFERENCE TO RELATED APPLICATIONS

This application is related to an application entitled "Computer Module With Integrated Cover Latching and Attachment Mechanism" bearing attorney docket number RPS9-2001-0065 and filed on the same date as the instant application. This related application is incorporated by reference into the instant application.

BACKGROUND OF THE INVENTION

This invention pertains to computers and other information processing systems and, more particularly, to such a system for receiving one or more stackable and removable modules, wherein each module includes an integrated mechanism that both latches the module's cover to its base and also attaches the module to a computer.

The invention described below provides for a modular computer or other electrical equipment chassis in which a single mechanism is used to both hold the module base and cover together, as well as to secure the module in the chassis such that the module's connectors are locked to the mating connectors of the chassis. In addition, this mechanism inhibits the separation of the module base and cover when the module is properly installed in the chassis. This mechanism requires no tools to remove the module from the chassis, nor are any tools required to separate the module's base from its cover once the module has been removed from the chassis.

SUMMARY OF THE INVENTION

Briefly, the invention is a modular electrical system including a chassis for receiving a plurality of stackable modules. The chassis includes a cam lobe engaging mechanism having a lip for engaging a cam shaft lobe, and a first chassis connector coupled to chassis electronic components. A first module includes a first module connector coupled to first module electronic components and a first module lever and cam assembly. The first module lever and cam assembly includes a lever arm attached to a cam shaft having a first lobe. The first module lever and cam assembly is rotatable between first and second positions. The first module is inserted into the chassis such that the first lobe of the first module is adjacent the lip of the cam lobe engaging mechanism when the first module lever and cam assembly is in the first position. The first lobe of the first module engages the lip of the cam lobe engaging mechanism at a first location when the first module lever and cam assembly is moved to the second position, such that the first module connector is moved into engagement with the first chassis connector when the first module lever and cam assembly is in the second position.

DESCRIPTION OF THE ILLUSTRATIVE EMBODIMENTS

Figure 1:
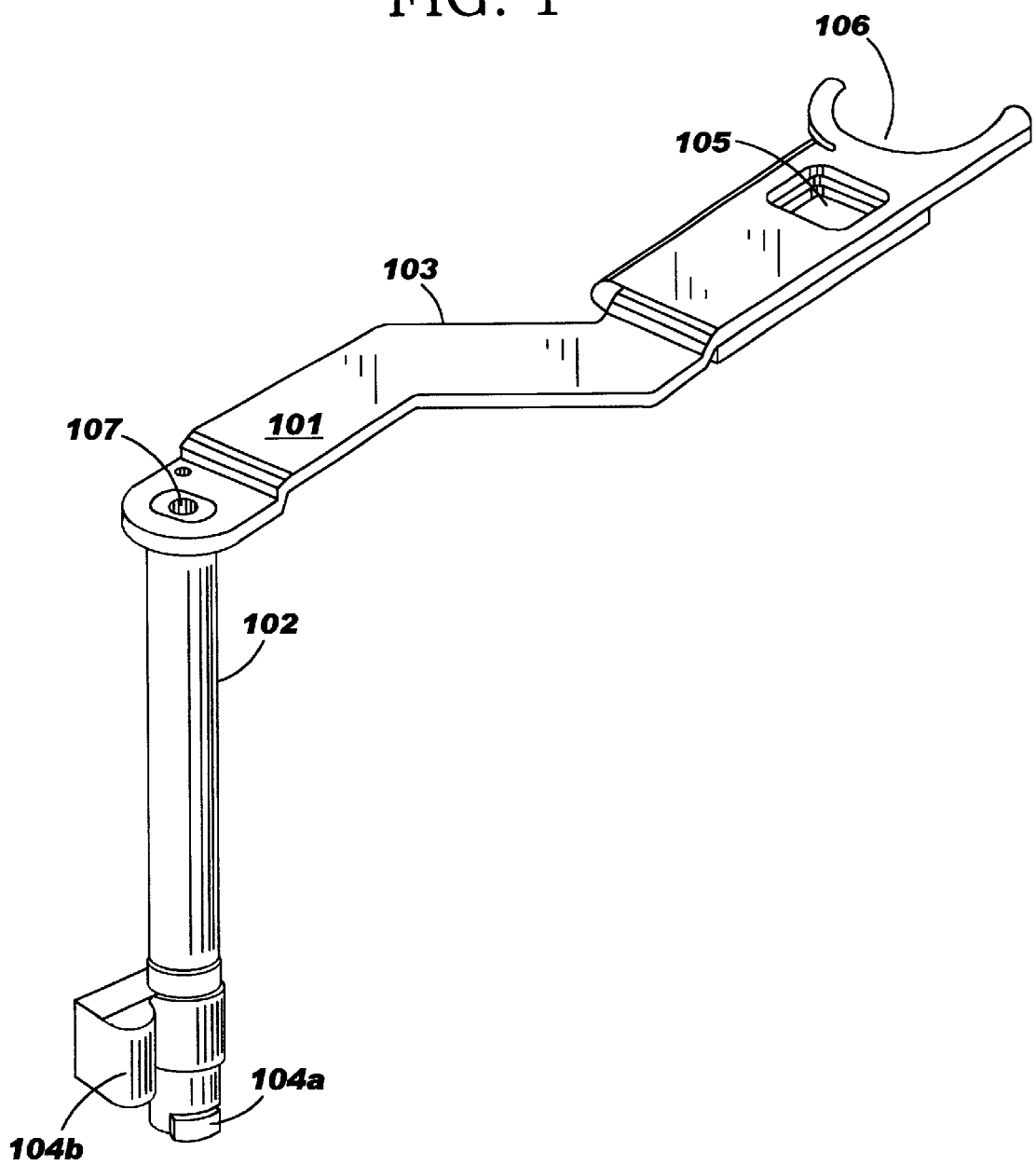
FIG. 1 is a perspective view of the lever and cam assembly.

Referring to FIG. 1, lever and cam assembly 101 includes cam shaft 102 having a lever arm 103 attached at one end of the cam shaft. Cam shaft 102 includes cam lobes 104a and 104b, which are spaced apart "vertically" (ie, longitudinally along cam shaft 102). Lever arm 103 includes latch hole 105 for receiving a latching tab to be described in more detail below. Lever arm 103 also includes finger hole 106, which aids in the movement of the lever arm one position to another. A threaded hole 107 receives a bolt 207 (see FIG. 2) for securing arm 103 to cam shaft 102. Other well know methods of attaching an arm to a shaft may also be used.

Figure 2:
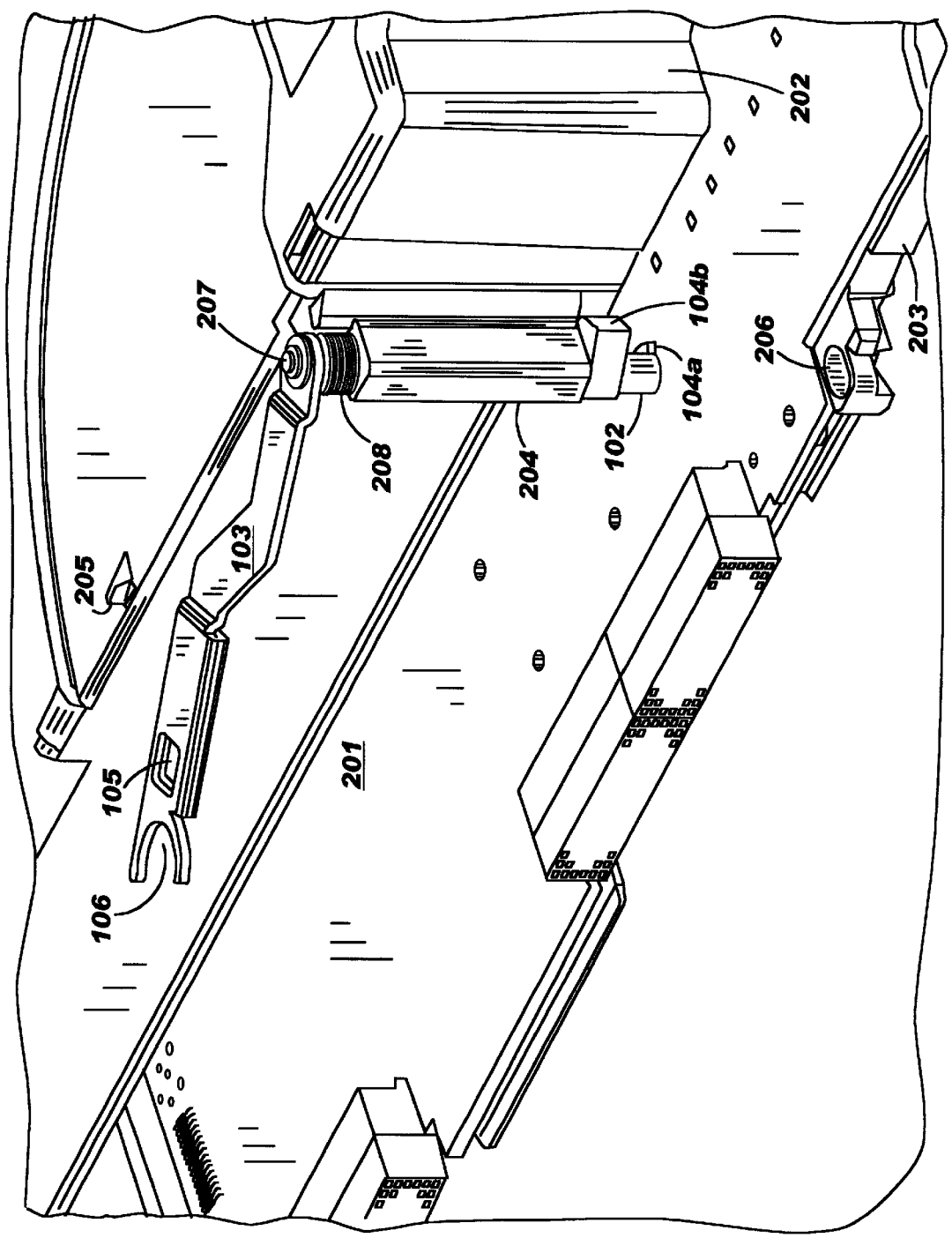
FIG. 2 is a perspective view of the module of the present invention illustrating the module cover separated from the base, as well as the multi-lobed lever and cam assembly in the first position.
Figure 3:
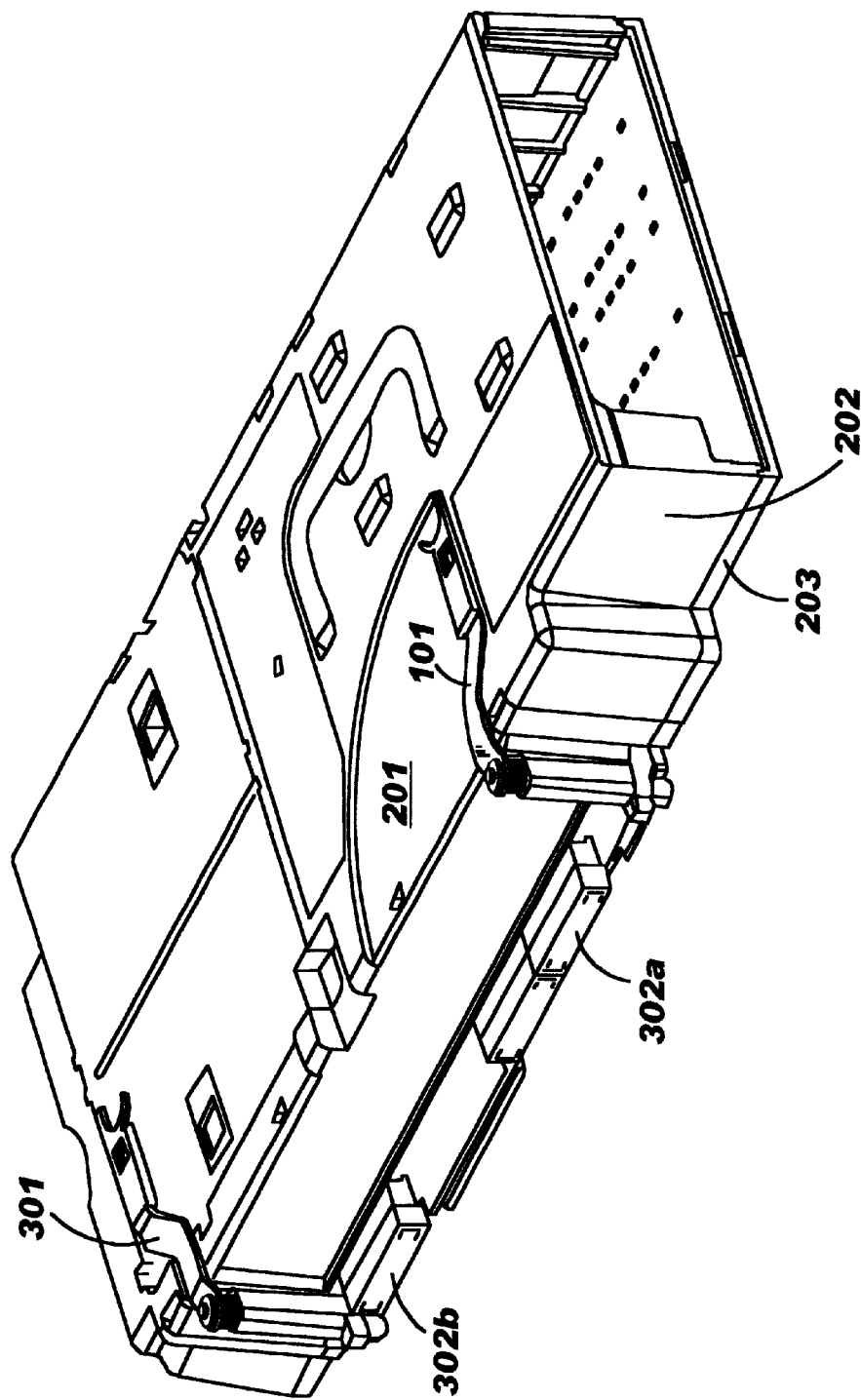
FIG. 3 is a perspective view of the module of the present invention illustrating the module cover attached to the base, with the lever and cam assembly in the third position.

FIG. 2 is a perspective view of module 201 wherein module cover 202 is separated from module base 203, and lever and cam assembly 101 is in the first position. Referring to this figure, module 201 includes cover 202 and base 203. Cover 202 includes a boss 204 having an elongated cylindrical hole to receive cam shaft 102 while permitting the cam to rotate within the boss. A torsion spring 208 biases lever and cam assembly 101 towards the third or "rear" position (which is illustrated in FIG. 3), requiring a small degree of force to manually move lever 103 to the second and first positions. (The first position is the "forward" position illustrated in FIG. 2, while the second or "middle" position occurs when arm 103 is positioned such that tab 205 is engaged in hole 105.) During assembly, cam shaft 102 is first inserted into the hole in boss 204, torsion spring 208 is placed over the top of shaft 102, and then lever arm 103 is attached to the shaft by turning bolt 207 into threaded hole 107.

A latch tab 205 engages latch hole 105 in lever arm 103 to releasably lock lever and cam assembly 101 in the second or "middle" position. Other well known latching mechanisms may also be substituted for latch hole 105 and latch tab 205. When lever arm 103 is in the second position, lifting the lever arm slightly causes latch tab 205 to be disengaged from latch hole 105, thereby permitting the lever arm to be moved to the first or third positions (unless otherwise inhibited).

FIG. 3 is a perspective view of module 201 wherein module cover 202 is attached to base 203, and lever and cam assembly 101 is in the third or "rear" position. Referring to this figure, cover 202 is locked to base 203 when arm and cam assembly 101 is in the third position, as well as the second position. Preferably, a second lever arm and cam shaft assembly 301 is used, although the invention may be practiced with only one such assembly. Second lever arm and cam assembly 301 is a mirror image of assembly 101, but is otherwise substantially similar. Connectors 302a and 302b are accessible from the lever and cam assembly side of module 201.

Figure 4:
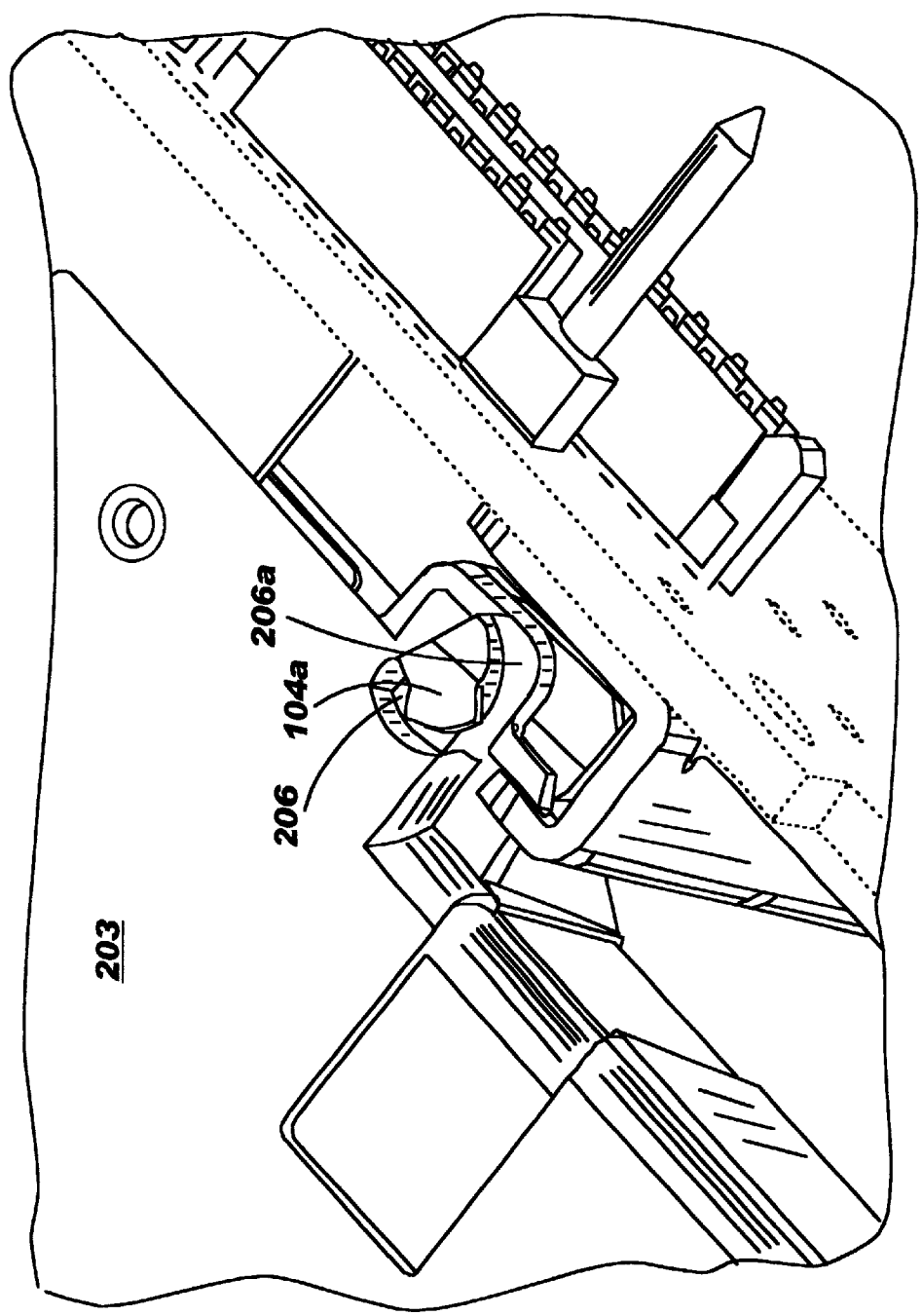
FIG. 4 is a perspective view of the bottom of the module illustrating the first ("lower") lobe of the cam and the eccentric retaining hole of the module base, in which the lever and cam assembly is in the second position such that the base is secured to the cover.

FIG. 4 is a perspective view of the bottom of module 201 illustrating first cam lobe 104a and eccentric retaining hole 206 of module base 203 in which lever and cam assembly 101 is in the second position such that the base is secured to module cover 202. Referring to FIGS. 2 and 4, base 203 includes an eccentric hole 206 for receiving lower cam lobe 104a. Lower lobe 104a is designed to pass through eccentric hole 206 in base 203 only when lever and cam assembly 101 is in the first or "forward" position. To attach base 203 to cover 202, lever arm 103 is moved to the first position, and then cam lobe 104a is inserted into eccentric hole 206. Next, lever arm 103 is moved to the second or third position, which causes cam lobe 104a to engage a lip 206a around hole 206, thereby locking cover 202 to base 203.

Figure 5:
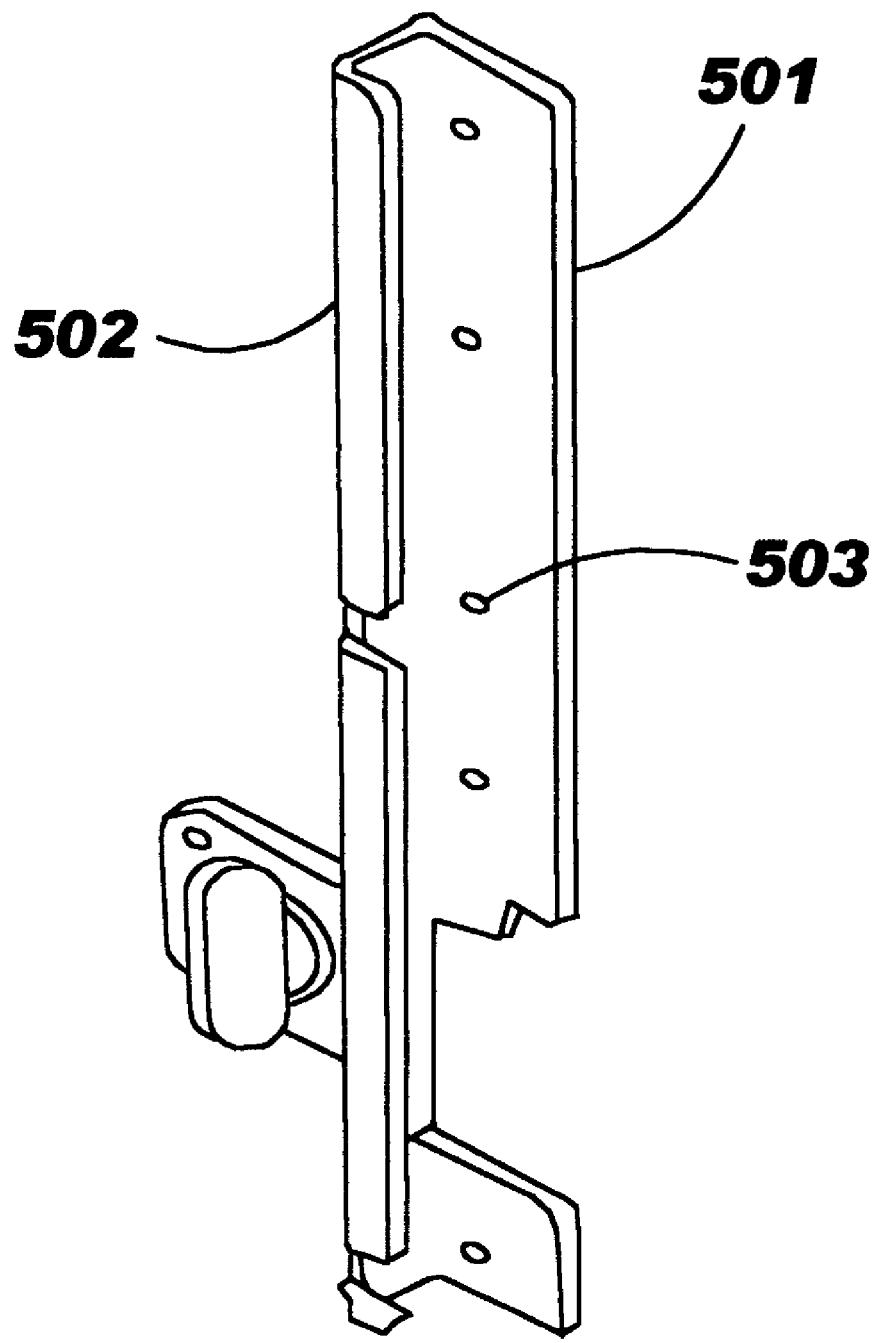
FIG. 5 is a perspective view of the cam lobe engaging mechanism.

FIG. 5 is a perspective view of cam lobe engaging mechanism 501. Referring to this figure, cam lobe engaging mechanism 501 is generally "U" shaped in cross section and includes a lip 502 that preferably extends the full length of the mechanism. Holes 503 are provided for attaching the cam lobe engaging mechanism directly to a computer or other electrical system chassis, or indirectly to a printed circuit board attached to the chassis.

Figure 6:
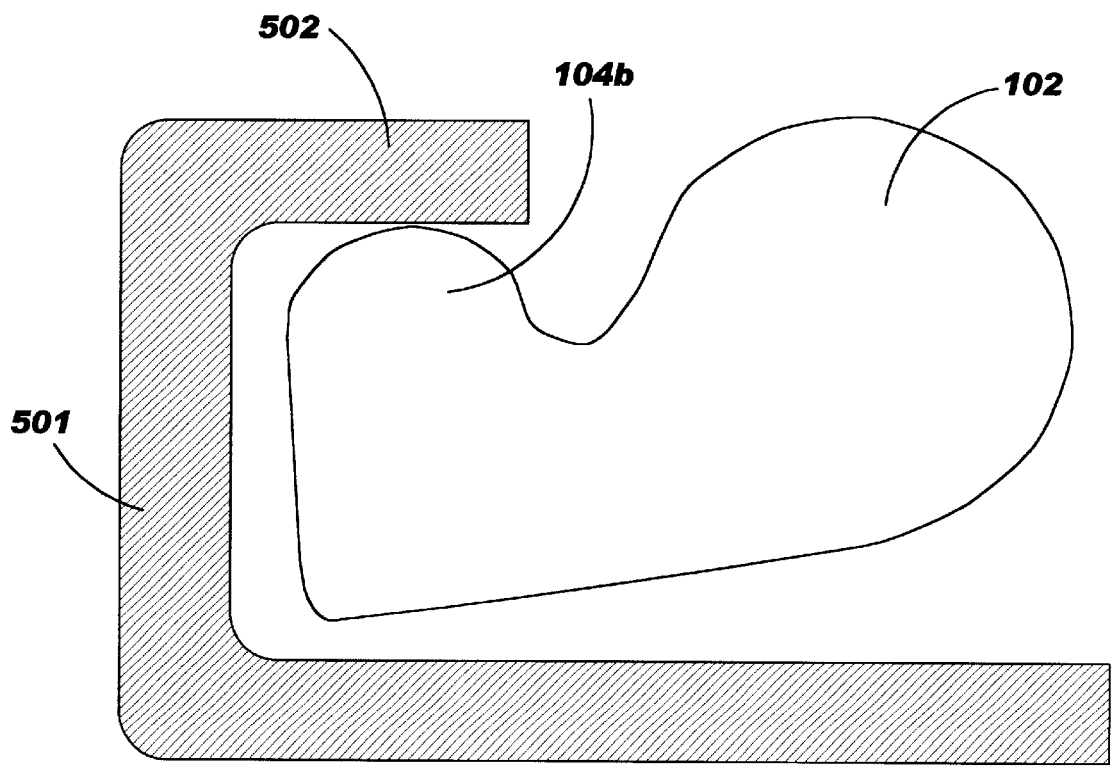
FIG. 6 is a partial sectional view illustrating the upper cam lobe of the lever and cam assembly engaging the lip of the cam lobe engaging mechanism when the lever and cam assembly is in the second position.

FIG. 6 is a partial cross sectional view of cam lobe engaging mechanism and cam shaft 102, wherein lever and cam assembly 101 is illustrated in the second position. Referring to this figure, it should noted that upper cam lobe 104b is in contact with the inner surface of lip 502 of mechanism 501. This occurs when arm and cam shaft assembly 101 is in the second position. When installing module 201 into an electrical equipment chassis, lever and cam assembly 101 is moved to the third position and then the module is inserted into the chassis. Next, lever and cam assembly 101 is moved to the second position as illustrated in FIG. 6, thereby securing module 201 in the chassis. It should be noted that when lever and cam assembly is in the second position and cam lobe 104b is engaged against the inner surface of lip 502, the lever and arm assembly cannot be moved to the first position, thereby preventing module base 203 from being unlocked from module cover 202.

Figure 7:
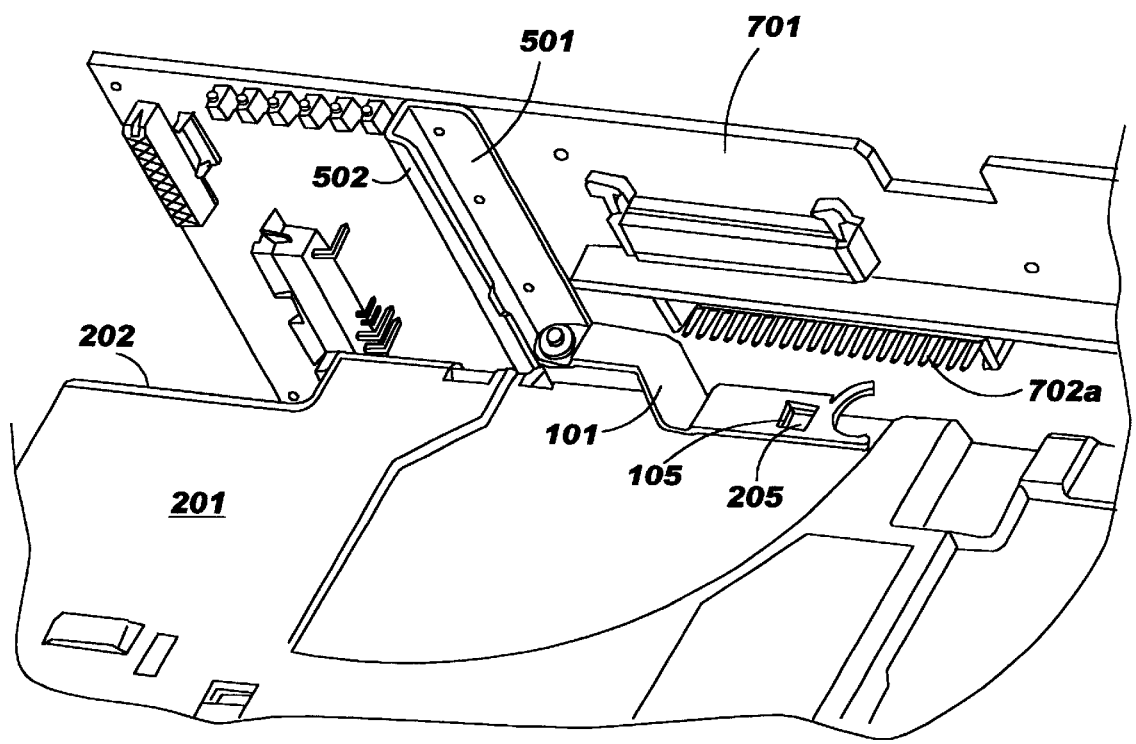
FIG. 7 is a perspective view of a backplane circuit board of an electrical equipment chassis illustrating the cam lobe engaging mechanism, one backplane-to-module connector, and one module with the lever and-cam assembly in the second position.

FIG. 7 is a perspective view of module 201 illustrating cam lobe engaging mechanism 501 and one of the chassis-to-module connectors 702a of the electrical system chassis. Referring to this figure, tab 205 is engaged in hole 105, thereby releasably locking lever and cam assembly 101 in the second position. A computer chassis or other electrical equipment chassis having an attached "backplane" printed circuit board 701 includes cam lobe engaging mechanism 501 attached to the backplane, although it may also be attached directly to the backplane's chassis. Attachment may be by rivets, screws, or other well known attaching methods. To attach module 201 to backplane 701, lever and arm assembly 101 is moved to the third position and the module is inserted into the chassis such that upper cam lobe 104b is adjacent lip 502. Next, lever and cam assembly 101 is moved to the second position (the position illustrated in FIG. 7), which causes upper cam lobe 104b to engage lip 502 of engaging mechanism 501, which locks module 201 to backplane 701, thereby securing the module in the chassis. In the process of moving lever and cam assembly 101 from the third to the second position, module connector 302a (visible in FIG. 3) is also pulled into mechanical and electrical contact with backplane connector 702a, thereby establishing an electrical connection between module 201 and backplane 701.

Figure 8:
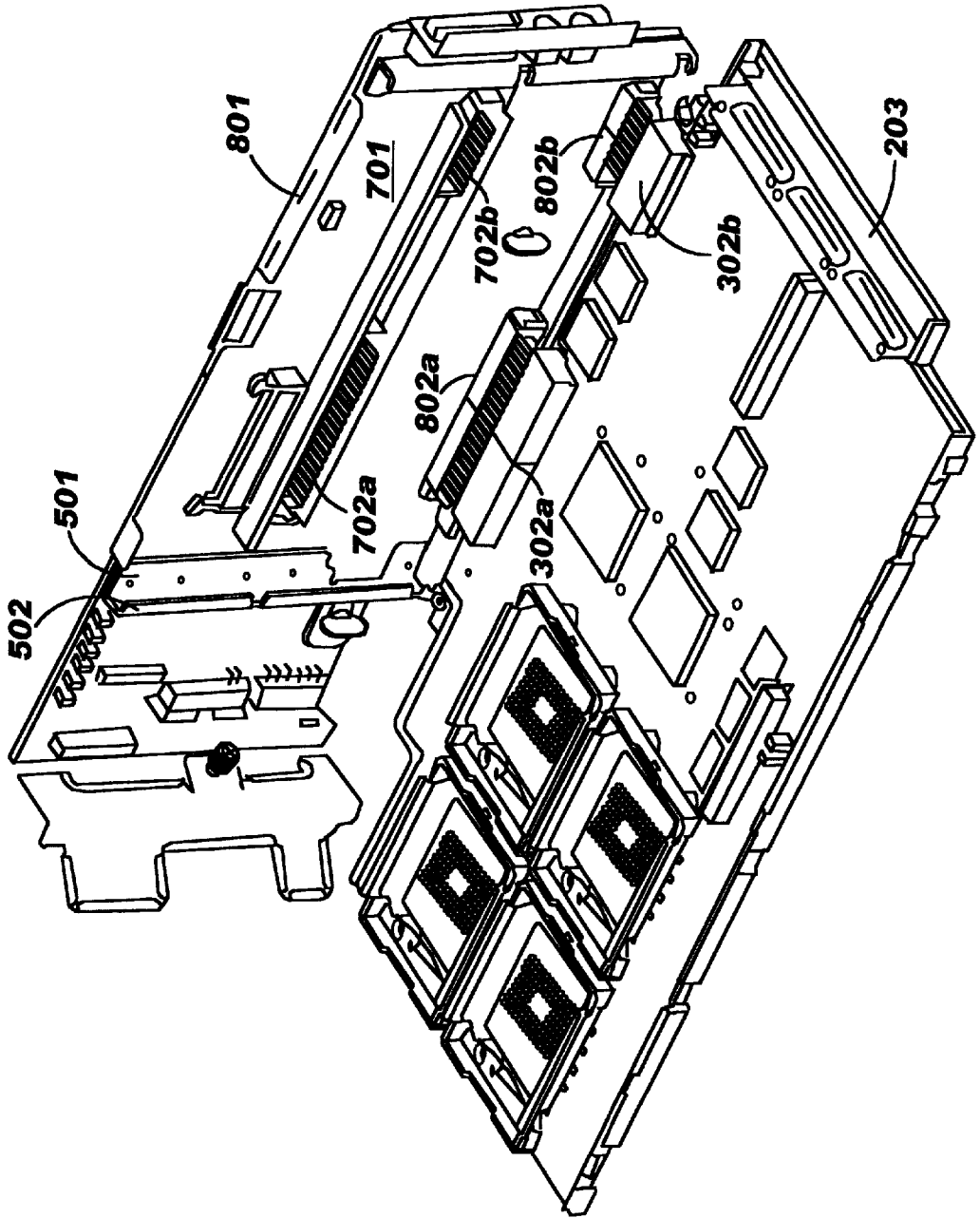
FIG. 8 is a perspective view of an electrical equipment chassis having a backplane circuit board with two rows of backplane-to-module connectors suitable for receiving two modules, one stacked on top of the other; wherein a "lower" module is illustrated with the cover removed, exposing the module base, module circuit board and module-to-backplane connectors.

FIG. 8 is a perspective view of an electrical equipment chassis 801 having a backplane circuit board 701 with two rows (702a&b and 802a&b) of backplane-to-module connectors suitable for receiving two modules, one stacked on top of the other; wherein a "lower" module 201 is illustrated with its cover 202 removed, exposing the module base 203, module circuit board with electronic components and module-to-backplane connectors 302. Referring to this figure, a computer or other electrical system chassis 801 (only a portion of the chassis is visible in FIG. 8) includes backplane printed circuit board 701 attached to the chassis in a conventional manner. A lower row of connectors is formed by backplane-to-module connectors 802a and 802b, while an upper row is formed by backplane-to-module connectors 702a and 702b. These two rows of connectors permit two modules, such as module 201, to be attached to backplane 701; one module stacked over the other. Note that cam lobe engaging mechanism 501 extends across almost the full height of backplane 701 such that two cam lobes 104b in each of two modules (stacked one above the other) can engaged lip 502 at two different points. This allows for two or more modules 201 to be stacked.

What is claimed is:

1. A modular electrical system, comprising:
   a chassis for receiving a plurality of stackable modules, said chassis including:
      a cam lobe engaging mechanism having a lip for engaging a cam shaft lobe; and
      a first chassis connector coupled to chassis electronic components;
   a first module including:
      a first module connector coupled to first module electronic components;
      a first module lever and cam assembly comprising a lever arm attached to a cam shaft, said cam shaft having a first lobe, said first module lever and cam assembly being rotatable between first and second positions;
   said first module being inserted into said chassis such that said first lobe of said first module is adjacent said lip of said cam lobe engaging mechanism when said first module lever and cam assembly is in said first position, and said first lobe of said first module engages said lip of said cam lobe engaging mechanism at a first location when said first module lever and cam assembly is moved to said second position, such that said first module connector is moved into engagement with said first chassis connector when said first module lever and cam assembly is in said second position.

2. The modular electrical system of claim 1, wherein:
   said chassis further comprises a second chassis connector coupled to said chassis electronics; and
   said modular electrical system further comprises a second module, said second module including:
      a second module connector coupled to second module electronic components;
      a second module lever and cam assembly comprising a lever arm attached to a cam shaft, said cam shaft having a first lobe, said lever and cam assembly being rotatable between first and second positions;

said second module being inserted into said chassis such that said first lobe of said second module is adjacent said lip of said cam lobe engaging mechanism when said second module lever and cam assembly is in said first position, and said first lobe of said second module engages said lip of said cam lobe engaging mechanism at a second location when said second module lever and cam assembly is moved to said second position, such that said second module connector is moved into engagement with said second chassis connector when said second module lever and cam assembly is in said second position, and such that said second module is stacked adjacent said first module.

3. The modular electrical system of claim 1, wherein said first module includes:

a second cam lobe attached to said cam shaft, said lever and cam assembly being rotatable to a third position;

first and second housing portions, said first housing portion including a slot having an eccentric shape for receiving said second cam lobe, said second cam lobe engaging said first housing portion to lock said first housing portion to said second housing portion when said lever and cam assembly is in said first and second, whereby said first housing portion can be locked to and unlocked from said second housing portion depending on the position of said lever and cam assembly.

4. The modular electrical system of claim 3 wherein said first cam lobe of said first module is adapted to engage said cam lobe engaging mechanism when said lever and cam assembly is in said second position to inhibit the movement of said lever and cam assembly into said third position, thereby inhibiting the detachment of said second housing portion from said first housing portion when said module is locked to said electrical system.

5. The modular electrical system of claim 2, wherein said first module includes:

a second cam lobe attached to said cam shaft, said lever and cam assembly being rotatable to a third position;

first and second housing portions, said first housing portion including a slot having an eccentric shape for receiving said second cam lobe, said second cam lobe engaging said first housing portion to lock said first housing portion to said second housing portion when said lever and cam assembly is in said first and second, whereby said first housing portion can be locked to and unlocked from said second housing portion depending on the position of said lever and cam assembly.

6. The modular electrical system of claim 5 wherein said first cam lobe of said first module is adapted to engage said cam lobe engaging mechanism when said lever and cam assembly is in said second position to inhibit the movement of said lever and cam assembly into said third position, thereby inhibiting the detachment of said second housing portion from said first housing portion when said module is locked to the electrical system.

* * * * *